(12) United States Patent
Higashi et al.

(10) Patent No.: US 6,803,300 B2
(45) Date of Patent: Oct. 12, 2004

(54) METHOD OF MANUFACTURING A SEMICONDUCTOR DEVICE HAVING A GROUND PLANE

(75) Inventors: Kazuyuki Higashi, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 10/314,995

(22) Filed: Dec. 10, 2002

(65) Prior Publication Data

US 2003/0080432 A1 May 1, 2003

Related U.S. Application Data

(62) Division of application No. 09/957,020, filed on Sep. 21, 2001, now Pat. No. 6,515,365.

(30) Foreign Application Priority Data

Sep. 21, 2000 (JP) ........................................ 2000-287717

(51) Int. Cl.⁷ .................................................. H01L 21/44
(52) U.S. Cl. ........................ 438/598; 438/599; 438/612; 438/618; 438/622; 438/624; 438/625; 438/637; 438/638; 438/642; 438/652; 438/666; 438/669; 438/672
(58) Field of Search .................................. 438/598–599, 438/612, 618, 622, 624–625, 637–638, 642, 652, 666, 669, 672

(56) References Cited

U.S. PATENT DOCUMENTS

| | | |
|---|---|---|
| 4,755,483 A | 7/1988 | Haku et al. |
| 5,532,516 A | 7/1996 | Pasch et al. |
| 5,625,232 A | 4/1997 | Numata et al. |
| 5,763,954 A | 6/1998 | Hyakutake |
| 5,889,330 A | 3/1999 | Nishimura et al. |
| 5,973,348 A | 10/1999 | Ishibashi |
| 6,037,664 A | 3/2000 | Zhao et al. |
| 6,190,957 B1 | 2/2001 | Mochizuki et al. |
| 6,215,189 B1 | 4/2001 | Toyoda et al. |
| 6,232,221 B1 | 5/2001 | Tran et al. |
| 6,232,563 B1 | 5/2001 | Kim et al. |
| 6,255,732 B1 | 7/2001 | Yokoyama et al. |
| 6,268,661 B1 | 7/2001 | Kakuhara |
| 6,277,732 B1 | 8/2001 | Lou |
| 6,359,328 B1 | 3/2002 | Dubin |
| 6,445,071 B1 | 9/2002 | Haruhana et al. |
| 6,458,634 B1 * | 10/2002 | Stevens ...................... 438/149 |
| 6,720,245 B2 * | 4/2004 | Stucchi et al. .............. 438/614 |
| 2002/0102835 A1 * | 8/2002 | Stucchi et al. .............. 438/618 |
| 2002/0155645 A1 * | 10/2002 | Stevens ...................... 438/149 |

FOREIGN PATENT DOCUMENTS

| | | |
|---|---|---|
| JP | 11-233624 | 8/1999 |
| JP | 11-330393 | 11/1999 |

* cited by examiner

*Primary Examiner*—Lynne A. Gurley
(74) *Attorney, Agent, or Firm*—Finnegan, Henderson, Farabow, Garrett & Dunner, L.L.P.

(57) ABSTRACT

A semiconductor device includes at least first and second lower layer wirings provided on a surface of an insulator on a semiconductor substrate, a first interlayer film provided on the insulator to cover surfaces of the first and second lower layer wirings, first and second connection wirings which are provided on the first interlayer film and include first and second films contacting the first and second lower layer wirings respectively, and a plate electrode which is continuously provided on the second connection wiring and includes at least the first film.

21 Claims, 5 Drawing Sheets

METHOD OF MANUFACTURING A SEMICONDUCTOR DEVICE HAVING A GROUND PLANE

CROSS-REFERENCE TO RELATED APPLICATIONS

This is a division of application Ser. No. 09/957,020, filed Sep. 21, 2001, now U.S. Pat. No. 6,515,365, which is incorporated herein by reference.

This application is based upon and claims the benefit of priority from the prior Japanese Patent Application No. 2000-287717, filed Sep. 21, 2000, the entire contents of which are incorporated herein by reference.

BACKGROUND OF THE INVENTION

1. Field of the Invention

The present invention relates to a semiconductor device having a ground plane and a manufacturing method thereof. More specifically, the present invention concerns a ground plane and a formation method thereof applied to semiconductor elements such as logic LSI (Large Scale Integrated circuit), memory LSI including DRAM (Dynamic Random Access Memory) and SRAM (Static Random Access Memory), and analog LSI comprising bipolar transistors.

2. Description of the Related Art

Generally, the multilayer wiring used for semiconductor elements is easily affected by a signal noise (crosstalk noise) due to mutual capacitance or mutual inductance between adjacent connections. In recent years, as interconnections become finer, the affect of this crosstalk noise increases and is becoming a cause of preventing fabrication of high-speed elements. Particularly in the field of LSI evaluation boards, crosstalk noise is becoming hindrance to evaluation of LSI's high performance.

An LSI evaluation board having damascene structure plate electrodes is proposed as a solution for decreasing the crosstalk noise. This board is provided with a metallic plate having ground potentials called a ground plane at least on or under the wiring.

There is an increasing demand for applying such a structure for decreasing the crosstalk noise in ordinary LSI chips.

FIGS. 9A and 9B provide examples of applying a ground plane used for conventional LSI evaluation boards to ordinary LSI chips.

In FIG. 9A, an insulator 102 is formed on an Si substrate 101. On the surface of the insulator 102, there are formed damascene-structure lower layer wirings 103A and 103B. The lower layer wirings 103A and 103B are made of liner metal 103a such as TaN and wiring metal 103b such as Cu, respectively.

An interlayer film 105 is formed via a barrier film 104 on the insulator 102 provided with the lower layer wirings 103A and 103B. On the interlayer film 105, there are formed dual damascene structure connection wirings 106A and 106B. The connection wiring 106A leads to the lower layer wiring 103A. The connection wiring 106B leads to the lower layer wiring 103B. The connection wiring 106A comprises a ViaPlug section 106A-1 and a wiring section 106A-2. The connection wiring 106B comprises a ViaPlug section 106B-1 and a ground plane 106B-2. The connection wiring 106A and 106B are made of liner metal 106a such as TaN and plug metal 106a such as Cu, respectively.

An interlayer film 108 is formed via a barrier film 107 on the interlayer film 105 provided with the connection wirings 106A and 106B. On the interlayer film 108, there is formed a dual damascene structure upper layer wiring 109 leading to the connection wiring 106A. The upper layer wiring 109 comprises a ViaPlug section 109A-1 and a wiring section 109A-2. The upper layer wiring 109 is formed of liner metal 109a such as TaN and wiring metal 109b such as Cu.

In this configuration, a ground potential is supplied to the ground plane 106B-2 via the lower layer wiring 103B. This suppresses occurrence of crosstalk noise due to mutual capacitance or mutual inductance between adjacent wirings.

However, there arise various problems when a conventional multilayer wiring process is used to provide the above-mentioned configuration. For example, when the ground plane 106B-2 is formed by a formation process for dual damascene wiring which is being put to practical use, say, for Cu wiring, a phenomenon called "dishing" occurs. In this case, as shown in FIG. 9B, there is the problem that the inside of a pattern sinks largely. For example, when the CMP (Chemical Mechanical Polishing) method is used to flatten Cu, dishing occurs, which excessively scrapes the inside of a wide pattern such as the ground plane 106B-2. This phenomenon is not only an obstacle to the ground potential, but also may adversely affect lithography and CMP when wiring is formed on a layer thereon.

As mentioned above, a prior art method can decrease crosstalk noise by forming the ground plane. This, however, has the drawback that dishing causes the inside of a pattern to sink largely when an attempt is made to provide the ground plane by means of a conventional formation process for dual damascene wiring.

BRIEF SUMMARY OF THE INVENTION

According to a first aspect of the present invention, there is provided a semiconductor device comprising at least first and second lower layer wirings provided on a surface of an insulator on a semiconductor substrate; a first interlayer film provided on the insulator to cover surfaces of the first and second lower layer wirings; first and second connection wirings which are provided on the first interlayer film and comprise first and second films contacting the first and second lower layer wirings respectively; and a plate electrode which is continuously provided on the second connection wiring and comprise the first film.

According to a second aspect of the present invention, there is provided a manufacturing method of a semiconductor device comprising forming at least first and second lower layer wirings on a surface of an insulator provided on a semiconductor substrate; forming a first interlayer film on the insulator to cover surfaces of the first and second lower layer wirings; forming first and second through-holes which reach the first and second lower layer wirings through the first interlayer film; forming a first film on a surface of the first interlayer film including insides of the first and second through-holes; forming a second film on the first film and completely filling the first and second through-holes; selectively removing the second film remaining on the first film except insides of the first and second through-holes; and patterning the first film and forming first and second connection wirings connected to the first and second lower layer wirings respectively and a plate electrode continuous with the second connection wiring.

DETAILED DESCRIPTION OF THE INVENTION

Embodiments of the present invention will be described in further detail with reference to the accompanying drawings.

(First Embodiment)

Figure 1:
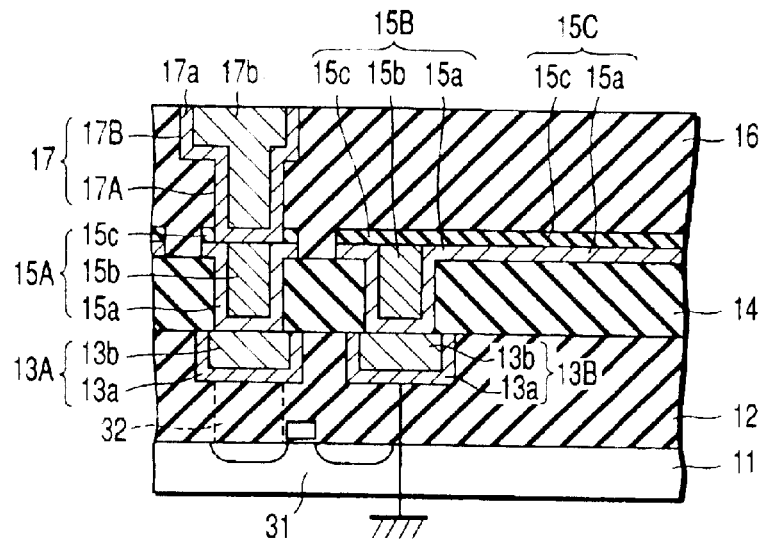
FIG. 1 is a sectional view showing a configuration example of a semiconductor device according to a first embodiment of the present invention.

FIG. 1 shows a configuration example of a semiconductor device according to the first embodiment of the present invention.

In FIG. 1, an insulator 12 is formed on an Si substrate (semiconductor substrate) 11. On the surface of the insulator 12, there are formed damascene structure lower layer signal wires (first and second lower layer wirings) 13A and 13B. The lower layer signal wires 13A and 13B are made of liner metal 13a such as TaN and wiring metal 13b such as Cu, respectively.

The lower layer signal wire 13A is electrically connected to an element section 31 formed on the surface of the Si substrate 11 by means of a contact 32.

An interlayer insulator (first interlayer film) 14 is provided on the insulator 12 where the lower layer signal wires 13A and 13B are provided. On this interlayer insulator 14, there are formed damascene structure connection wirings 15A (first connection wiring) and 15B (second connection wiring). The connection wirings 15A leads to the lower layer signal wire 13A. The connection wirings 15B leads to the lower layer signal wire 13B. On the interlayer insulator 14, there is formed a ground plane (plate electrode) 15C leading to the connection wiring 15B.

The connection wiring 15A and 15B each have a ViaPlug configuration. This configuration comprises a liner metal 15a (first film) such as TaN and a plug metal 15b (second film) such as Cu or Ag having lower resistance than the liner metal 15a. Further, the connection wiring 15A and 15B each include a barrier film 15c (third film) such as $Al_2O_3$ for preventing oxidation and diffusion of the plug metal 15b.

The ground plane 15C is formed by using the liner metal 15a for configuring the connection wirings 15A and 15B. The ground plane 15C contains the barrier film 15c. Namely, this embodiment forms the ground plane 15C integrally with the connection wiring 15B by means of the liner metal 15a and the barrier film 15c.

An interlayer insulator 16 (second interlayer film) is provided on the interlayer insulator 14 where the connection wirings 15A and 15B and the ground plane 15C are provided. On this interlayer insulator 16, there is formed a dual damascene structure upper layer signal wire 17 (first upper layer wiring) piercing the barrier film 15c and connecting to the connection wiring 15A. The upper layer signal wire 17 includes a ViaPlug section 17A and a wiring section 17B. The upper layer signal wire 17 comprises a liner metal 17a such as TaN and a wiring metal 17b such as Cu.

In this configuration, the lower layer signal wire 13A supplies a signal to the element section 31 via a contact 32. The lower layer signal wire 13B supplies a ground potential to the ground plane 15C. This configuration suppresses occurrence of crosstalk noise due to mutual capacitance or mutual inductance between adjacent signal wires.

The following describes how to manufacture the semiconductor device having the above-mentioned configuration with reference to FIGS. 2A to 2G. It should be noted that the element section 31 and the contact 32 are omitted from these figures.

Figure 2A:
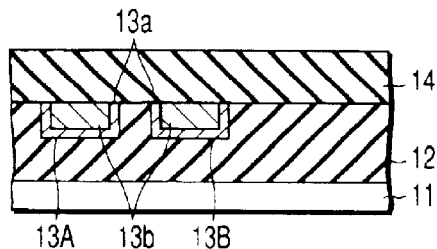
FIGS. 2A to 2G are sectional views showing processes for a method of manufacturing the semiconductor device in FIG. 1.

As shown in FIG. 2A, the insulator 12 is deposited on the Si substrate 11. A damascene wiring formation process is used to form the lower layer signal wires 13A and 13B on the surface. Thereafter, the interlayer insulator 14 is deposited on the entire surface.

Figure 2B:
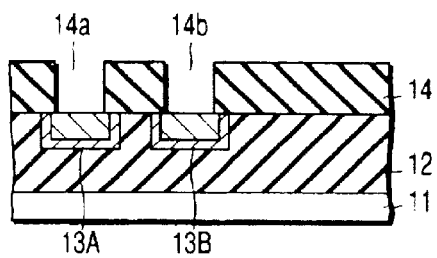

Then, as shown in FIG. 2B, there are formed Viaholes 14a and 14b in the interlayer insulator 14 leading to the lower layer signal wires 13A and 13B, respectively.

Figure 2C:
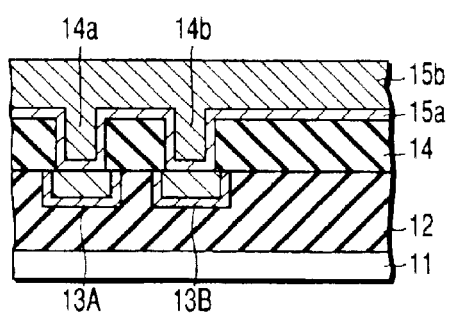

Then, as shown in FIG. 2C, the liner metal 15a such as TaN is formed on the entire surface by using a CVD process, a sputtering process, or a plating process. On the liner metal 15a, there is formed a plug metal 15b of, say, Cu or a material comprising Cu as a major component to completely fill in the Viaholes 14a and 14b.

Here, the liner metal 15a is made of Ti, W, Ta, Nb, Al, Zr, V, Hf, Mo, Si, or their nitrides or oxides, or a material containing each as a major component. The plug metal 15b is made of Cu or Ag, or metal containing each as a major component and needs to be protected against oxidation and diffusion. The plug metal 15b can be made of W, Al, Au, or metal containing each as a major component.

Figure 2D:
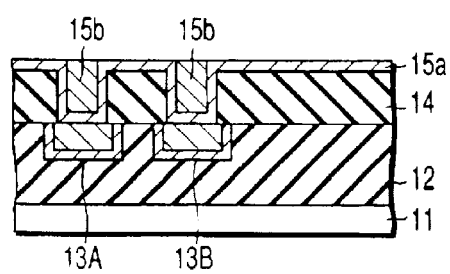

Then, as shown in FIG. 2D, the liner metal 15a is used as a stopper to remove the plug metal 15b remaining on a region except Viaholes 14a and 14b. When the CMP process is conducted under a condition which prevents the liner metal 15a from being removed, only the liner metal 15a remains on a region except ViaPlug.

Figure 2E:
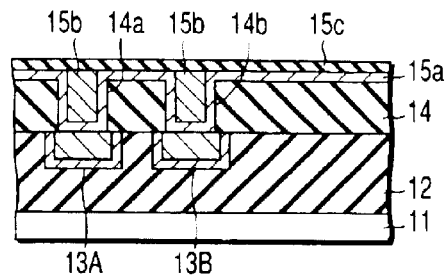

Then, as shown in FIG. 2E, the barrier film 15c is formed on the entire surface for preventing oxidation and diffusion of the plug metal 15b exposed in the Viaholes 14a and 14b.

Figure 3:
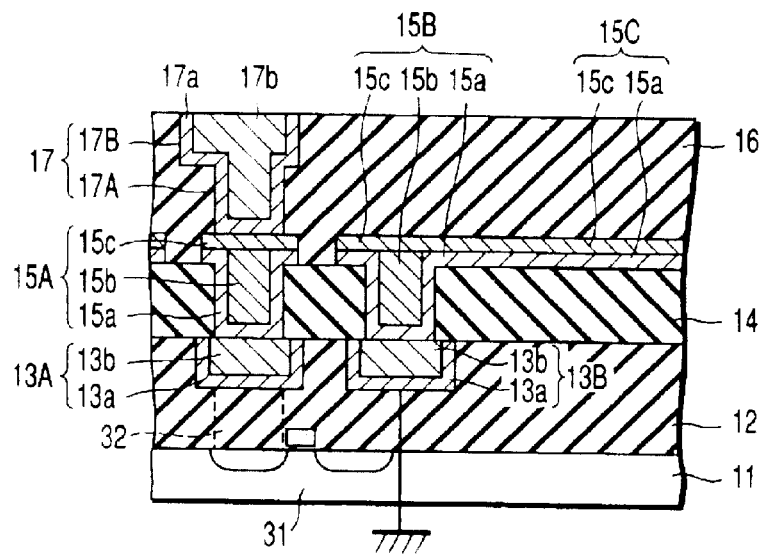
FIG. 3 is a sectional view showing another configuration example of a semiconductor device according to the first embodiment of the present invention.

Here, an insulator such as SiN or SiC is used for the barrier film 15c. Alternatively, as shown in FIG. 3, it is also possible to use Ti, W, Ta, Nb, Al, Zr, V, Hf, Mo, Si, or a conductive material such as nitride containing each as a major component SiCN, SiON, SiOC, Poly Arylene, and BCB (benzocyclobutene) can be used for the barrier film 15c.

Figure 2F:
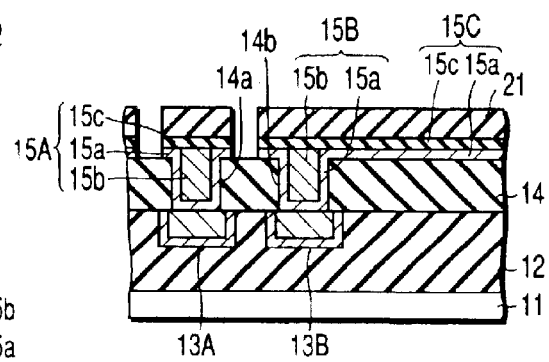

Then, as shown in FIG. 2F, a PEP process, an RIE process, a CDE process, or a wet etching process is used to pattern the liner metal 15a and the barrier film 15c masked with a resist pattern 21. There are formed the connection wirings 15A and 15B, and the ground plane 15C.

Figure 2G:
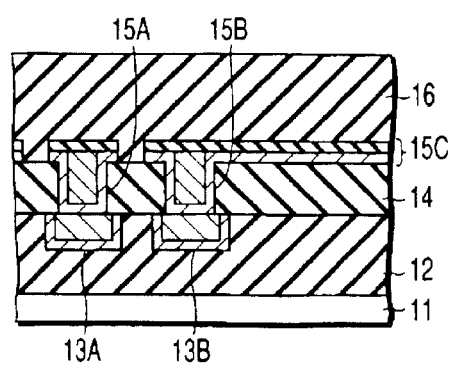

After the ground plane 15C is patterned, the resist pattern 21 is removed. As shown in FIG. 2G, the interlayer insulator 16 is deposited on the entire surface.

The dual damascene wiring formation process is used to form the upper layer signal wire 17 on the interlayer insulator 16, providing the semiconductor device having the configuration as shown in FIG. 1.

The above-mentioned processes makes it possible to easily form the ground plane 15C for decreasing crosstalk noise which prevents fabrication of high-speed elements without substantially changing the existing multilayer wiring process.

As mentioned above, the ground plane formation can use the liner metal used for the ViaPlug formation. Namely, the ground place need not use a low-resistance material such as the signal wire. Accordingly, it is possible to form the ground plane by using the liner metal or the barrier metal. The ground plane can be easily formed without the need for a special apparatus or process or without causing a dishing condition. Accordingly, it is possible to easily prevent the ground plane from sinking largely without substantially changing the existing multilayer wiring process.

In addition, the ViaPlug formation process is used for forming the ground plane. Accordingly, processes can be simplified. It is possible to decrease the number of processes compared to a case where ViaPlug and the ground plane are formed independently. By using the ViaPlug formation process, it is possible to stably form the ground plane by minimizing irregularities such as dents.

(Second Embodiment)

Figure 4:
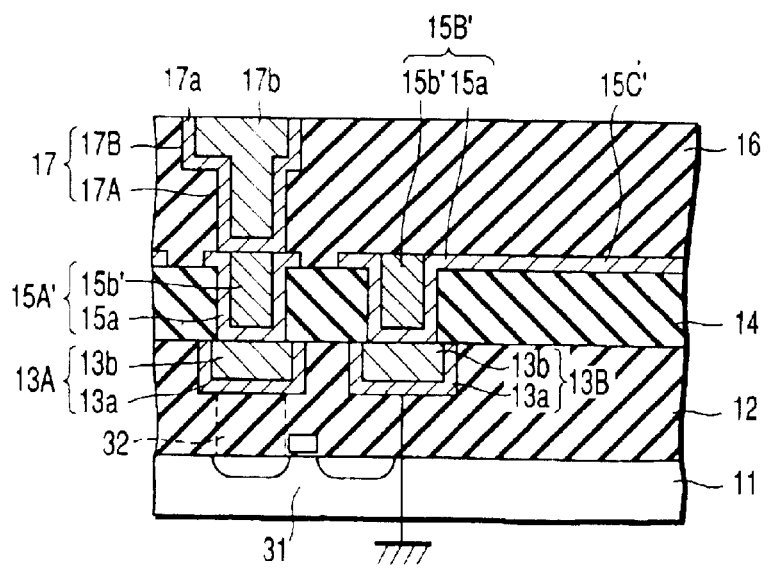
FIG. 4 is a sectional view showing a configuration example of a semiconductor device according to a second embodiment of the present invention.

FIG. 4 shows a configuration example of a semiconductor device according to the second embodiment of the present invention. Explained here is the semiconductor device using such metals as W, Al, Au, and the like which need not be protected against oxidation and diffusion.

In FIG. 4, an insulator 12 is formed on an Si substrate (semiconductor substrate) 11. On the surface of the insulator 12, there are formed damascene structure lower layer signal wires (first and second lower layer wirings) 13A and 13B. The lower layer signal wires 13A and 13B are made of liner metal 13a such as TaN and wiring metal 13b such as Cu, respectively.

The lower layer signal wire 13A is electrically connected to an element section 31 formed on the surface of the Si substrate 11 by means of a contact 32.

An interlayer insulator (first interlayer film) 14 is provided on the insulator 12 where the lower layer signal wires 13A and 13B are provided. On this interlayer insulator 14, there are formed damascene structure connection wirings 15A' (first connection wiring) and 15B' (second connection wiring). The connection wirings 15A' leads to the lower layer signal wire 13A. The connection wirings 15B' leads to the lower layer signal wire 13B. On the interlayer insulator 14, there is formed a ground plane (plate electrode) 15C' leading to the connection wiring 15B'.

The connection wiring 15A' and 15B' each have a ViaPlug configuration. This configuration comprises the liner metal 15a (first film) such as TiN and a plug metal 15b' (second film) such as W having lower resistance than the liner metal 15a.

The ground plane 15C' is formed by using the liner metal 15a for configuring the connection wirings 15A' and 15B'. Namely, this embodiment forms the ground plane 15C' integrally with the connection wiring 15B' by means of the liner metal 15a.

The interlayer insulator 16 (second interlayer film) is provided on the interlayer insulator 14 where the connection wirings 15A' and 15B' and the ground plane 15C' are provided. On this interlayer insulator 16, there is formed the dual damascene structure upper layer signal wire 17 (first upper layer wiring) connecting to the connection wiring 15A'. The upper layer signal wire 17 includes the ViaPlug section 17A and the wiring section 17B. The upper layer signal wire 17 comprises the liner metal 17a such as TaN and the wiring metal 17b such as Cu.

In this configuration, the lower layer signal wire 13A supplies a signal to the element section 31 via a contact 32. The lower layer signal wire 13B supplies a ground potential to the ground plane 15C'. This configuration suppresses occurrence of crosstalk noise due to mutual capacitance or mutual inductance between adjacent signal wires.

The following describes how to manufacture the semiconductor device having the above-mentioned configuration with reference to FIGS. 5A to 5G. It should be noted that the element section 31 and the contact 32 are omitted from these figures.

Figure 5A:
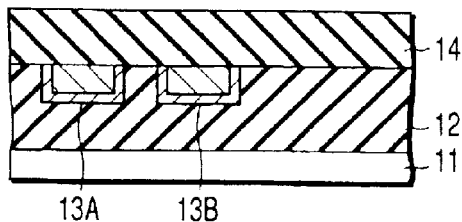
FIGS. 5A to 5G are sectional views showing processes for a method of manufacturing the semiconductor device in FIG. 4.

As shown in FIG. 5A, the insulator 12 is deposited on the Si substrate 11. A damascene wiring formation process is used to form the lower layer signal wires 13A and 13B on the surface. Thereafter, the interlayer insulator 14 is deposited on the entire surface.

Figure 5B:
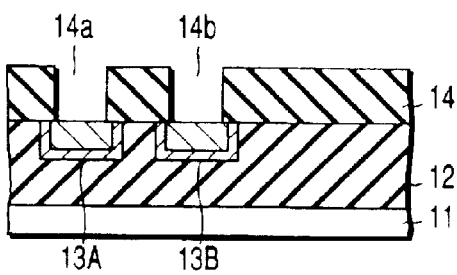
Figure 5C:
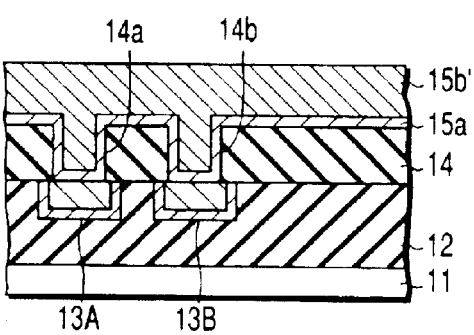

Then, as shown in FIG. 5B, there are formed Viaholes 14a and 14b in the interlayer insulator 14 leading to the lower layer signal wires 13A and 13B, respectively. Then, as shown in FIG. 5C, the liner metal 15a such as TiN is formed on the entire surface by using a CVD process, a sputtering process, or a plating process. On the liner metal 15a, there is formed plug metal 15b' of, say, tungsten (W) or a material comprising W as a major component to completely fill in the Viaholes 14a and 14b.

Here, the liner metal 15a is made of Ti, W, Ta, Nb, Al, Zr, V, Hf, Mo, Si, their nitride or oxide, or a material containing each as a major component. The plug metal 15b' is made of Al or Au, or metal containing each as a major component and needs not be protected against oxidation and diffusion in addition to W. Accordingly, no barrier film needs to be formed in the subsequent processes.

Figure 5D:
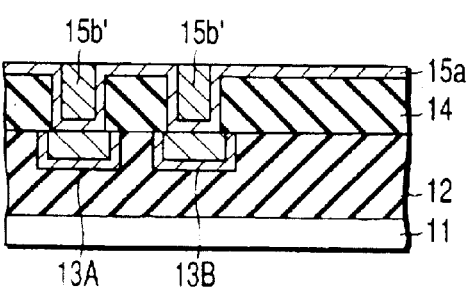
Figure 5E:
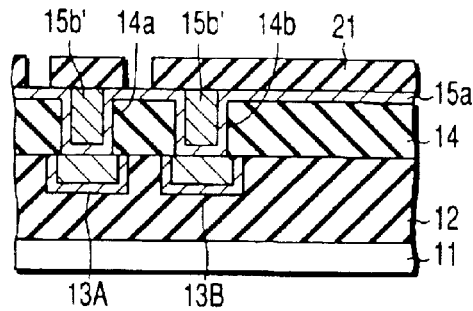

Then, as shown in FIG. 5D, the liner metal 15a is used as a stopper to remove the plug metal 15b' remaining on a region except Viaholes 14a and 14b. When the CMP process is conducted under conditions which prevent the liner metal 15a from being removed, only the liner metal 15a remains on a region except the ViaPlug.

Figure 5F:
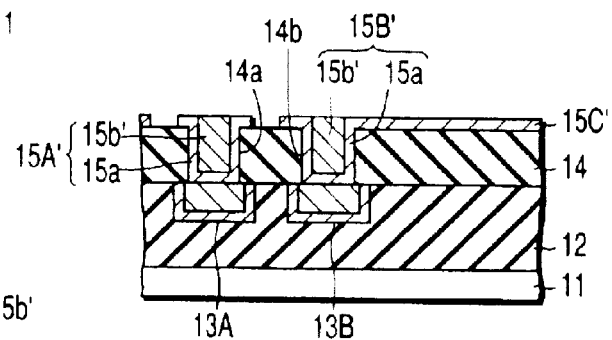

As shown in FIG. 5F, the resist pattern 21 is formed on the entire surface. Then, a PEP process, an RIE process, a CDE process, or a wet etching process is used to pattern the liner metal 15a and the barrier film 15c masked with the resist pattern 21. Thus, there are formed the connection wirings 15A' and 15B', and the ground plane 15C'.

Figure 5G:
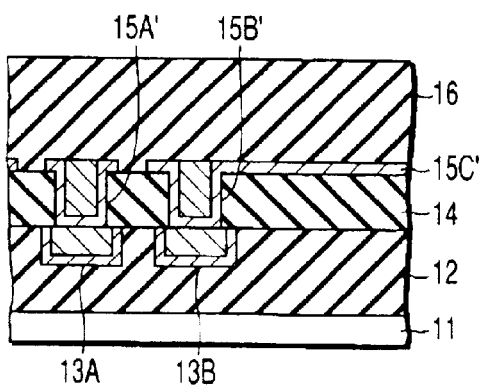

After the ground plane 15C' is patterned, the resist pattern 21 is removed as shown in FIG. 5F. As shown in FIG. 5G, the interlayer insulator 16 is deposited on the entire surface.

The dual damascene wiring formation process is used to form the upper layer signal wire 17 on the interlayer insulator 16, providing the semiconductor device having the configuration as shown in FIG. 4.

Like the first embodiment, the above-mentioned processes make it possible to easily form the ground plane 15C' for decreasing crosstalk noise which prevents fabrication of high-speed elements without substantially changing the existing multilayer wiring process.

Besides, the second embodiment forms a ViaPlug by using the metal which need not be protected against oxidation and diffusion. Accordingly, it is possible to omit formation of the barrier film as described in the first embodiment.

Needless to say, the surface of the plug metal 15b' can be protected by a barrier film such as SiN, SiC, SiCN, SiON, SiOC, Poly Arylene, and BCB (benzocyclobutene).

Even if a slight mask misalignment occurs in the ground plane, it is possible to maintain high process consistency between upper and lower signal wires.

The Plug metal 15b' can be made of Cu or Ag, or metal containing each as a major component.

(Third Embodiment)

Figure 6:
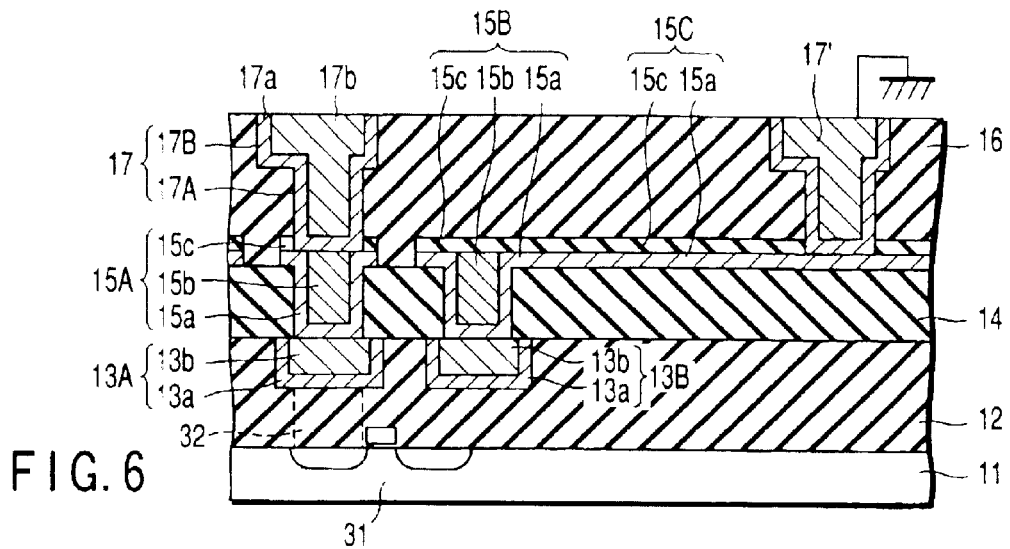
FIG. 6 is a sectional view showing an example of a third embodiment of the present invention applied to the semiconductor device in FIG. 1.
Figure 7:
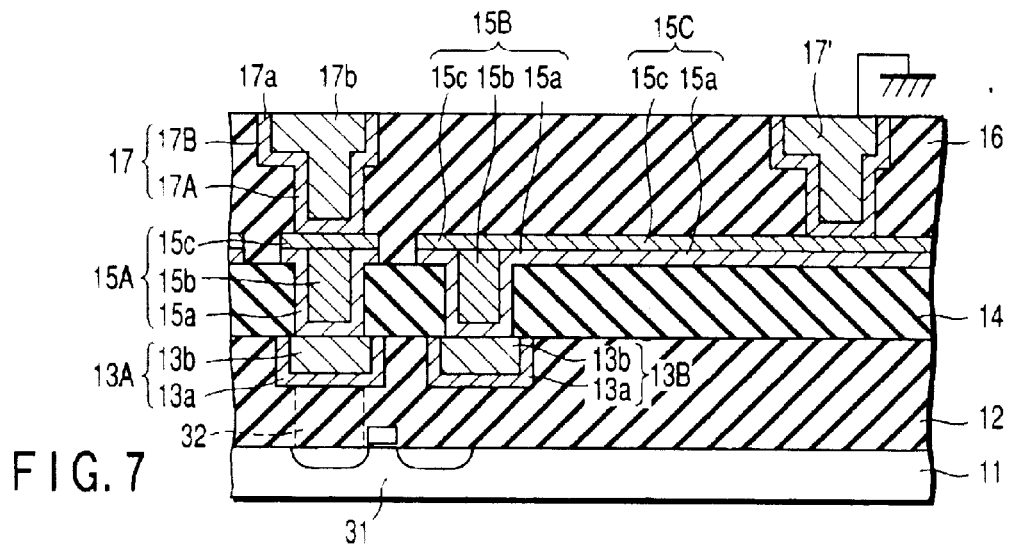
FIG. 7 is a sectional view showing an example of the third embodiment of the present invention applied to the semiconductor device in FIG. 3.
Figure 8:
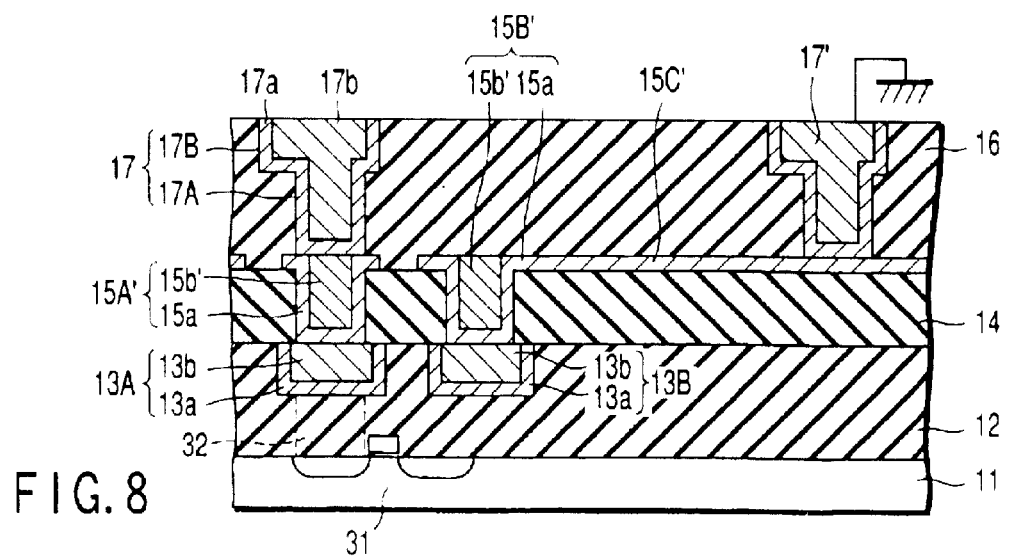
FIG. 8 is a sectional view showing an example of the third embodiment of the present invention applied to the semiconductor device in FIG. 4.
Figure 9A:
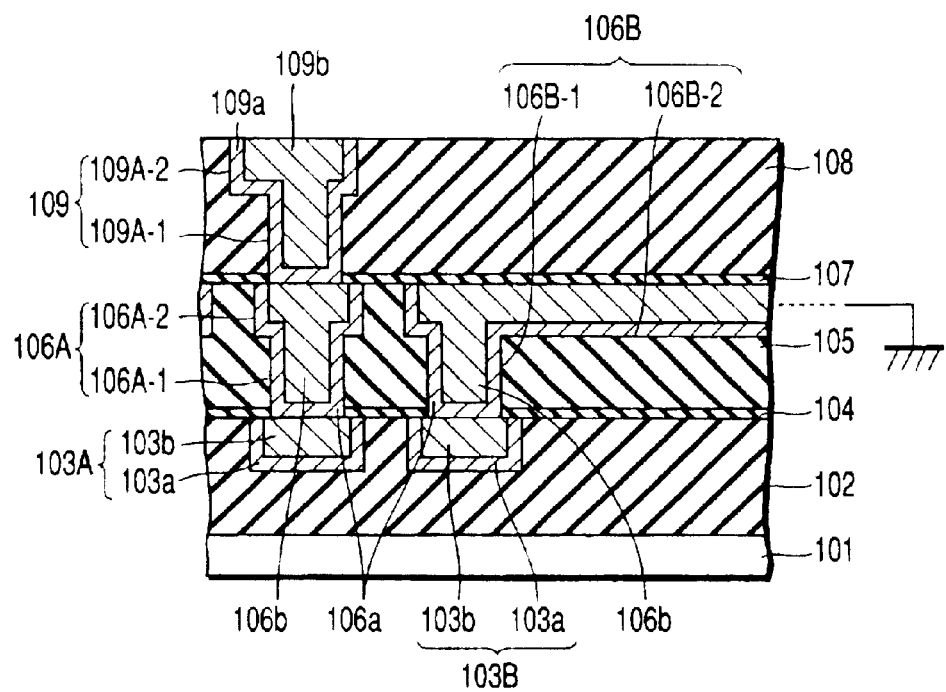
FIGS. 9A and 9B are sectional views of a semiconductor device for explaining a prior art and problems thereof.
Figure 9B:
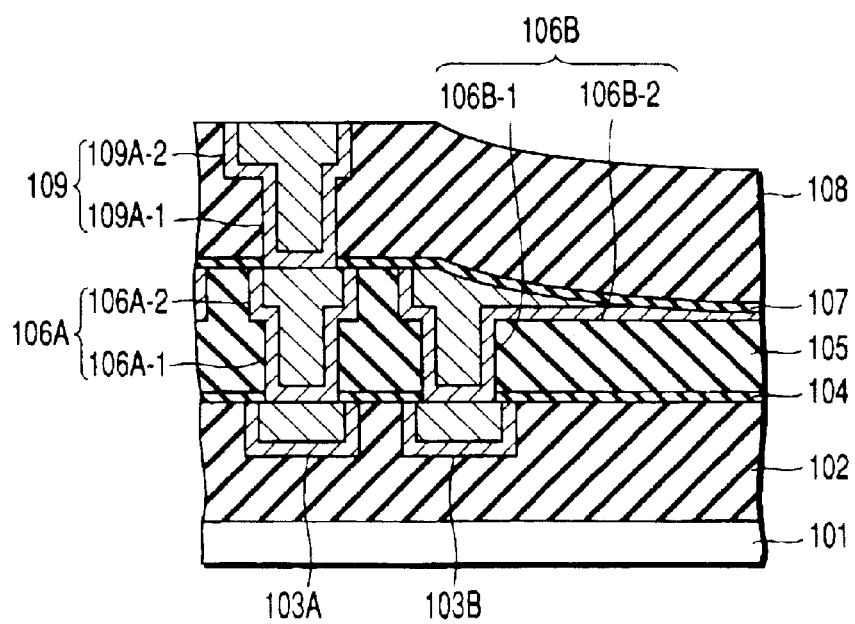

The above-mentioned first and second embodiments have explained the examples in which the lower layer signal wire 13B supplies a ground potential to the ground planes 15C and 15C'. The present invention is not limited thereto. As shown in FIGS. 6 to 8, it is also possible to supply a ground potential from an upper layer signal wire 17' (second upper layer wiring). The upper layer signal wire 17' can be formed concurrently with the formation of the upper layer signal wire 17 by means of similar processes. In any of these examples, it is possible to omit the lower layer signal wire 13B, and the connection wirings 15B and 15B'.

As has been described above in detail, the above-described embodiments can provide a semiconductor device and a manufacturing method thereof capable of decreasing crosstalk noise and easily preventing a plate electrode from sinking largely due to dishing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
    forming at least first and second lower layer wirings on a surface of an insulator provided on a semiconductor substrate;
    forming a first interlayer film on said insulator to cover surfaces of said first and second lower layer wirings;
    forming first and second through-holes which reach said first and second lower layer wirings through said first interlayer film;
    forming a first film on a surface of said first interlayer film including insides of said first and second through-holes;
    forming a second film on said first film and completely filling said first and second through-holes;
    selectively removing said second film remaining on said first film except insides of said first and second through-holes; and
    patterning said first film and forming first and second connection wirings connected to said first and second lower layer wirings respectively and a plate electrode continuous with said second connection wiring.

2. The manufacturing method according to claim 1, further comprising:
    forming a second interlayer film on said first interlayer film including said first and second connection wirings and said plate electrode; and
    forming an upper layer wiring connected to at lest said first connection wiring on said second interlayer film.

3. The manufacturing method according to claim 1, wherein
    said first lower layer wiring is a signal wire configured to supply a signal to an element section provided on said semiconductor substrate and said second lower layer wiring is a signal wire configured to supply a ground potential to said plate electrode.

4. The manufacturing method according to claim 1, wherein
    said first film comprises at least one of Al, W, Ti, Ta, Nb, V, Zr, Hf, Mo, Si, a nitride thereof, an oxide, and a material containing each as a major component.

5. The manufacturing method according to claim 1, wherein
    said second film comprises at least one of W, Al, Au, Cu, Ag, and a material containing each as a major component.

6. The manufacturing method according to claim 1, further comprising:
    forming a third film on an entire surface of a resultant structure after selectively removing said second film; and
    patterning said third film in the same shape as said first film and forming said first and second connection wirings and said plate electrode.

7. The manufacturing method according to claim 6, wherein
    said second film comprises at least one of Cu, Ag, W, Al, Au, and a material containing each as a major component.

8. The manufacturing method according to claim 6, wherein
    said third film comprises at least one of W, Ti, Ta, Nb, Al, V, Zr, Hf, Mo, Si, a nitride thereof, an oxide, and a material containing each as a major component.

9. The manufacturing method according to claim 6, wherein
    said third film comprises at least one of $Al_2O_3$, SiN, SiC, SiCN, SiON, SiOC, Poly Arylene, and BCB (benzocyclobutene).

10. The manufacturing method according to claim 1, wherein
    said first and second lower layer wirings comprise a damascene structure.

11. The manufacturing method according to claim 2, wherein
    said upper layer wiring comprises a damascene structure.

12. A manufacturing method of a semiconductor device, comprising:
    forming at least one lower layer wiring on a surface of an insulator provided on a semiconductor substrate;
    forming a first interlayer film on said insulator to cover a surface of said lower layer wiring;
    forming a through-hole which reaches said lower layer wiring through said first interlayer film;
    forming a first film on a surface of said first interlayer film including an inside of said through-hole;
    forming a second film on said first film and completely filling said through-hole;
    selectively removing said second film remaining on said first film except an inside of said through-hole;
    patterning said first film and forming a connection wiring connected to said lower layer wiring and a plate electrode;

forming a second interlayer film on said first interlayer film including said connection wiring and said plate electrode; and forming a first upper layer wiring connected to said connection wiring and a second upper layer wiring connected to said plate electrode on said second interlayer film.

13. The manufacturing method according to claim 12, wherein said first upper layer wiring is a signal wire configured to supply a signal to an element section provided on said semiconductor substrate and said second upper layer wiring is a signal wire configured to supply a ground potential to said plate electrode.

14. The manufacturing method according to claim 12, wherein said first film comprises at least one of Al, W, Ti, Ta, Nb, V, Zr, Hf, Mo, Si, a nitride thereof, an oxide, and a material containing each as a major component.

15. The manufacturing method according to claim 12, wherein said second film comprises at least one of W, Al, Au, Cu, Ag, and a material containing each as a major component.

16. The manufacturing method according to claim 12, further comprising:

forming a third film on an entire surface of a resultant structure after selectively removing said second film; and patterning said third film in the same shape as said first film and forming said connection wiring and said plate electrode.

17. The manufacturing method according to claim 16, wherein said second film comprises at least one of Cu, Ag, W, Al, Au, and a material containing each as a major component.

18. The manufacturing method according to claim 16, wherein said third film comprises at least one of W, Ti, Ta, Nb, Al, V, Zr, Hf, Mo, Si, a nitrides thereof, an oxide, and a material containing each as a major component.

19. The manufacturing method according to claim 16, wherein said third film comprises at least one of $Al_2O_3$, SiN, SiC, SiCN, SiON, SiOC, Poly Arylene, and BCB (benzocyclobutene).

20. The manufacturing method according to claim 12, wherein said lower layer wiring comprises a damascene structure.

21. The manufacturing method according to claim 12, wherein said first and second upper layer wirings comprise a damascene structure.

* * * * *